(12) United States Patent
Roy

(10) Patent No.: US 6,583,487 B1
(45) Date of Patent: Jun. 24, 2003

(54) POWER COMPONENT BEARING INTERCONNECTIONS

(75) Inventor: Mathieu Roy, Joue les Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/421,130

(22) Filed: Oct. 19, 1999

(30) Foreign Application Priority Data

Oct. 23, 1998 (FR) .............................................. 98 13542

(51) Int. Cl.⁷ .............................................. H01L 23/58
(52) U.S. Cl. ........................ 257/496; 257/168; 257/488; 257/491; 257/510
(58) Field of Search ................................. 257/129, 168, 257/488, 496, 491, 510

(56) References Cited

U.S. PATENT DOCUMENTS

| | | | |
|---|---|---|---|
| 3,414,780 A | * 12/1968 | Diebold ....................... | 257/493 |
| 3,466,510 A | * 9/1969 | Maute ......................... | 257/491 |
| 3,559,006 A | * 1/1971 | Otsuka et al. ............... | 257/170 |
| 3,821,782 A | * 6/1974 | Hutson ........................ | 257/496 |
| 4,298,881 A | 11/1981 | Sakurada et al. ........... | 257/129 |
| 5,109,266 A | 4/1992 | Kida et al. .................... | 257/488 |
| 5,347,155 A | * 9/1994 | Ludikhuize ................... | 257/492 |
| 5,430,324 A | 7/1995 | Bencuya ...................... | 257/495 |
| 5,434,445 A | 7/1995 | Ravanelli et al. ........... | 257/488 |
| 5,496,761 A | 3/1996 | Ravanelli et al. ........... | 438/241 |
| 5,605,852 A | 2/1997 | Bencuya ...................... | 438/270 |
| 5,804,868 A | 9/1998 | Kobayashi et al. .......... | 257/630 |
| 5,864,167 A | 1/1999 | Cutter ......................... | 257/489 |
| 6,023,078 A | * 2/2000 | Baliga ......................... | 257/122 |
| 6,285,066 B1 | * 9/2001 | Meyer ......................... | 257/506 |

FOREIGN PATENT DOCUMENTS

| | | | |
|---|---|---|---|
| DE | 19533 956 | 3/1996 | ........... H01L/27/12 |
| EP | 0 813 250 | 12/1997 | ........... H01L/29/06 |
| JP | 3-56-158474 | * 12/1981 | ................. 257/496 |
| JP | 3-60-229371 | * 11/1985 | ................. 257/496 |
| JP | Hei 1-293661 | 11/1989 | |
| WO | WO 95/0437 | 2/1995 | |

OTHER PUBLICATIONS

French Search Report from related application No. 98 13219.
Patent abstracts of Japan, vol. 007, No. 045 (E–160), Feb. 23, 1983 & JP 57 196570 A Dec. 2, 1982 (inventor Uchida Shotaro).
U.S. patent application No, 09/420,478, filed, Oct. 19, 1999 entitled Power Component Bearing Interconnections, by Mathieu Roy.
French Search Report from application No. 98 13542, filed Oct. 23, 1998.
Patent Abstracts of Japan, vol. 014, No. 082 (E–0889), Feb. 15, 1990 & JP 01 293661 A, Nov. 27, 1989 (inventor Matsuura Tsutomu).
Elmar Falck, et al., Influence of Interconnectinos onto the Breakdown Voltage of Planar High–Voltage p–n Junctions, IEEE Transactions on Electron Devices, vol. 40, No. 2, Feb. 1, 1993, pp 439–447, XP000335349.

* cited by examiner

*Primary Examiner*—George Eckert
(74) *Attorney, Agent, or Firm*—Wolf, Greenfield & Sacks, P.C.; James H. Morris

(57) ABSTRACT

A power component formed in an N-type silicon substrate delimited by a P-type wall, having a lower surface including a first P-type region connected to the wall, and an upper surface including a second P-type region, a conductive track extending above the substrate between the second region and the wall. The component includes a succession of trenches extending in the substrate under the track and perpendicularly to this track, each trench being filled with an insulator.

52 Claims, 2 Drawing Sheets

POWER COMPONENT BEARING INTERCONNECTIONS

BACKGROUND OF THE INVENTION

1. Field of the Invention

The present invention relates to vertical power components, and more specifically to an optimization of the voltage breakdown of power components having interconnections on their upper surface.

2. Discussion of the Related Art

FIG. 1 very schematically shows a partial cross-sectional view of a portion of a high voltage power component in a border region thereof. The component, only a portion of which is illustrated, is formed in a lightly-doped silicon substrate 1. In the following description, it will be assumed that this substrate is of type N but, of course, all conductivity types could be inverted. The component is delimited at its periphery by an insulating wall 2, which extends from the upper surface to the lower surface of the substrate. The insulating wall can correspond to the limit of the semiconductive chip in which component 1 is formed. It can also correspond, within a semiconductive chip, to a separation between two adjacent components. Of course, the present invention also applies to components of silicon-on-insulator (SOI) type.

In a current configuration of high voltage vertical semiconductor components, a P-type layer 3 is formed, continuously or not, on the lower surface of the substrate and extends to reach the insulating wall. On the upper surface side of the substrate, a layer 4, also of type P, is arranged. P-type layer 4, N-type substrate 1, and P-type layer 3 are layers constitutive of a high voltage vertical component, the high voltage being withstandable especially due to the large thickness and to the small doping level of substrate 1. PNP layers 4-1-3 altogether can, for example, form a transistor.

A rear surface metallization M1 is in contact with the entire rear surface of the component and a metallization M2 is linked, directly or indirectly, to layer 4. This link is direct in the case where a PNP transistor is desired to be formed. In the case shown where a thyristor with or without a gate is desired to be formed, an additional heavily-doped N-type layer 5 is made to form the thyristor cathode in contact with metallization M2. The periphery of layer 4 is spaced apart from insulating wall 2 by a portion of substrate 1 and further includes, preferably, a lighltly-doped P-type (P$^-$) area 6 deeper than region 4.

When a positive voltage is applied between metalizations M1 and M2, the blocking junction is the junction between substrate 1 and P region 4–6. Around this junction, the breakdown voltage is ensured by a so-called space charge area delimited by equipotential surfaces E1L and E1H, shown in dotted lines in the drawing. Equipotential surface E1L indicates the area at the low potential of electrode M2, for example, 0 volt. Equipotential E1H designates the area at the high potential of electrode M1, for example, 600 volts.

When the device is reverse-biased, that is, metallization M2 is positively biased with respect to metallization M1, the breakdown voltage is essentially ensured by the junction between substrate 1 and, on the one hand, P layer 3, and on the other hand, insulating wall 2. E2L and E2H have been used to designate the limits of the space charge area, that is, the equipotential surfaces at the low potential and at the high potential, respectively. For a device to have a high breakdown voltage, the extreme equipotential surfaces have to be as distant as possible to avoid reaching the semiconductor breakdown potential (on the order of 20 V/$\mu$m). Thus, one of the layers in the vicinity of the junction which ensures the breakdown voltage should be relatively lightly doped so that the space charge area can extend rather widely therein.

Independently from the need to ensure a sufficient breakdown voltage of the component when high potentials are applied thereacross, leakage current problems also arise. For various reasons, for example, due to pollution of the oxides, it is possible for N substrate 1 to be strongly depleted at its surface under an upper insulating layer 8. An inversion of the population in this region may even be achieved. A channel region ensuring an electric continuity between the external periphery of P region 6 and the internal periphery of insulating wall 2 then appears. To avoid such leakage currents, it is known to use a so-called stop-channel region formed of a heavily-doped N-type (N$^+$) area 10 at the surface of substrate 1 between the external periphery of region 6 and the internal periphery of wall 2. Although this does not appear in cross-section, area 10 actually forms a ring, which extends over the entire periphery of the involved component. Given its high doping level, N$^+$ ring 10 is not likely to be inverted and thus interrupts any inversion channel likely to form at the component surface. To enhance the equipotentiality of stop-channel ring 10 and avoid the occurrence of a localized depletion, it is conventional to coat this diffused ring 10 with a metallization (not shown).

FIG. 2A illustrates what can be the effect on the equipotential distribution of a conductive track running over the upper surface of the component. In the example shown, metallization M2 is prolonged by a metal track L intended, for example, for ensuring a connection between metallization M2 and a metallization of another component arranged in the same substrate 1 to the right of insulating wall 2. It should be underlined, given that this is not apparent in the cross-sectional view of FIG. 2A, that metallization L corresponds to a relatively thin metal track as compared to the surface occupied by a contact metallization such as metallization M2. In power components, the metal track can have a width on the order of 10 to 100 $\mu$m. The way in which equipotential surfaces E1L and E1H on the one hand and equipotential surfaces E2L and E2H on the other hand deform, when the component is biased, respectively forward and in reverse, has been shown in FIG. 2A.

In the case where the component is forward biased, equipotential surface E1L is practically not deformed while equipotential surface E1H runs along the mechanical track in the direction of insulating wall 2. When it reaches said insulating wall, a punch-through occurs. This means that the component turns on, while it would be desired for it to be able to withstand the voltage while remaining off. This punch-through is not destructive but causes a premature start of a component which would be desired to remain off.

In a reverse biasing, essentially equipotential surface E2L deforms, at the level of the upper component portion. Then, the space charge area reduces and the field at the level of the upper portion of the junction between substrate 1 and wall 2 strongly increases. A breakdown of the junction can occur, which can cause a destruction thereof.

FIG. 2B shows an alternative of FIG. 2A in the case of the presence of a stop-channel region 10. In a forward biasing, equipotential surfaces E1 tend to deform as indicated in relation with FIG. 2A. However, the high equipotential surfaces (E1H) and the intermediary equipotential surfaces will come closer to one another in stop-channel region 10 and there is a high risk for a breakdown to occur in this area.

It can thus be seen that the presence of a stop-channel region, which avoids leakage currents, is prejudicial to the breakdown voltage in the considered case.

The problem discussed hereabove, which arises when a connection track runs over a high voltage component, is known in the art and various solutions have been provided to solve it.

An obvious solution consists of increasing the thickness of insulating layer 8 above which conductive track L runs, to reduce the influence on the semiconductor of the field created by this track. However, this solution rapidly comes up against practical limits. Indeed, it is difficult to deposit a high-quality insulator of a thickness greater than 6 $\mu$m which, for oxide, results in the best case in a voltage withstand on the order of 600 V.

Other solutions used for voltages greater than 600 V are illustrated in FIG. 3. FIG. 3 illustrates several solutions which are usually alternatively used.

A first solution consists of adding a lightly-doped P-type region 11, extending along the internal periphery of insulating wall 2 and in contact with this insulating wall. This improves the reverse breakdown voltage (junction between substrate 1 and insulating wall 2).

The other solutions consist of providing field plates.

According to a second solution, floating field plates 13 are arranged above insulating layer 8, perpendicularly to the track from which they are separated by an insulating layer 14. Then, if floating plates 13 clearly transversally extend beyond the track, they are not likely to be capacitively charged by said track and are capacitively coupled with the silicon. They then take charge of the equipotential surfaces by drawing them into the oxide area. However, this solution, based on the capacitor principle, strongly depends on the quality of the oxides and on their possible contamination. Further, it can require the use of submicronic lithography equipment, which is not necessarily available in power component manufacturing technologies.

According to a third solution, a field plate 15 in contact with insulating wall 2, extending inwards with respect to this insulating wall, is used. This type of structure solves the problem of cathode breakdown voltage since the equipotential surfaces are taken in charge between the field plate and the track before reaching the anode junction. However, this implies an extension of the field plate beyond the well, which adversely affects the breakdown voltage thereof. On the other hand, if the anode is grounded, the substrate is at the high voltage and the track is close to 0 volt (case of a substrate biased by the forward junction, the latter being connected to the cathode via a diffused resistor), the cathode and the anode then are simultaneously blocked and this solution does not work. Another solution should be to use a series of regions of the same doping type as the substrate but with a higher concentration, these regions extending transversally under the metallization. This solution necessitates a precise adjustment of the doping levels and of the distances between the doped regions.

Thus, prior art solutions have the disadvantage, either of requiring technologies of complex implementation, or of being efficient only for a specific biasing of the track with respect to the other elements, or of requiring an increase of the silicon surface used.

SUMMARY OF THE INVENTION

The present invention aims at solving the problem raised by the breakdown voltage of a power component in the presence of an interconnection track while avoiding one or several of the disadvantages of prior art structures.

To achieve these and other objects, the present invention provides a high voltage component formed in a region of a silicon substrate of a first conductivity type delimited by a wall of the second conductivity type, having a lower surface including a first region of the second conductivity type connected to the wall, and an upper surface including at least one second region of the second conductivity type, a high voltage being likely to exist between the first and second regions and having to be withstood on the upper surface side by the junction between the second region and the substrate or by the junction between the wall and the substrate, a conductive track being likely to be at a high potential extending above the substrate between the second region and the wall. The component includes a succession of trenches extending in the substrate under the track and perpendicularly to this track, each trench being filled with an insulator.

According to an embodiment of the present invention, each of the trenches has a depth on the order of 3 to 5 $\mu$m and a width on the order of 1.5 to 3 $\mu$m.

According to an embodiment of the present invention, the trenches are spaced apart by 10 to 30 $\mu$m.

According to an embodiment of the present invention, the trenches extend in the substrate over the entire component periphery.

The foregoing objects, features and advantages of the present invention will be discussed in detail in the following non-limiting description of specific embodiments in connection with the accompanying drawings.

DETAILED DESCRIPTION

In the various drawings, as conventional in the field of the representation of semiconductor components, the various dimensions are not drawn to scale, and have been arbitrarily drawn to ease the readability of the drawings and improve their intelligibility. Those skilled in the art will known how to adapt the various thicknesses and doping levels according to usual rules of semiconductor power component manufacturing.

Figure 1:
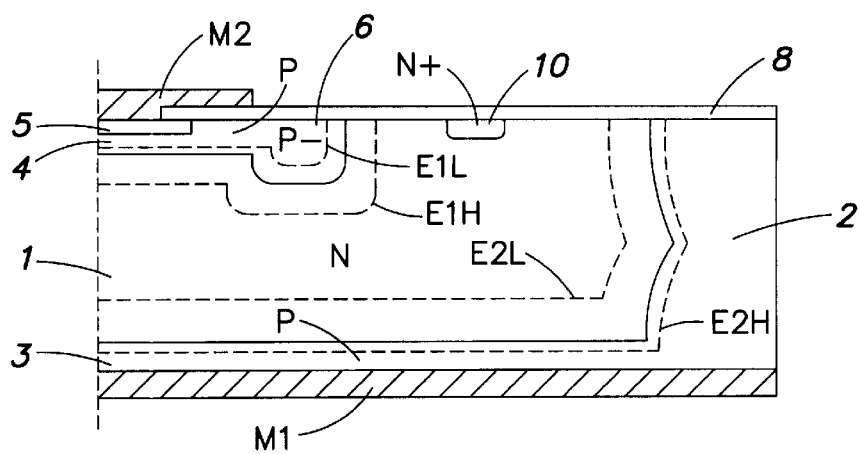
FIGS. 1, 2A, 2B, and 3 are simplified cross-sectional views of a limiting area of a high voltage component according to prior art.
Figure 2A:
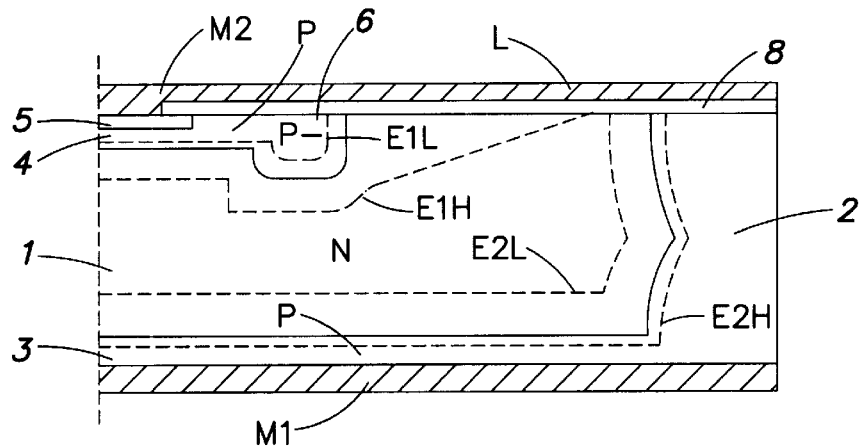
Figure 2B:
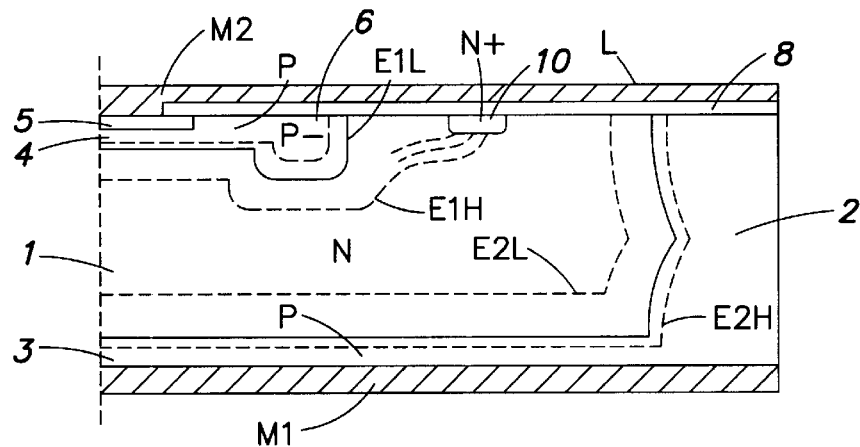
Figure 3:
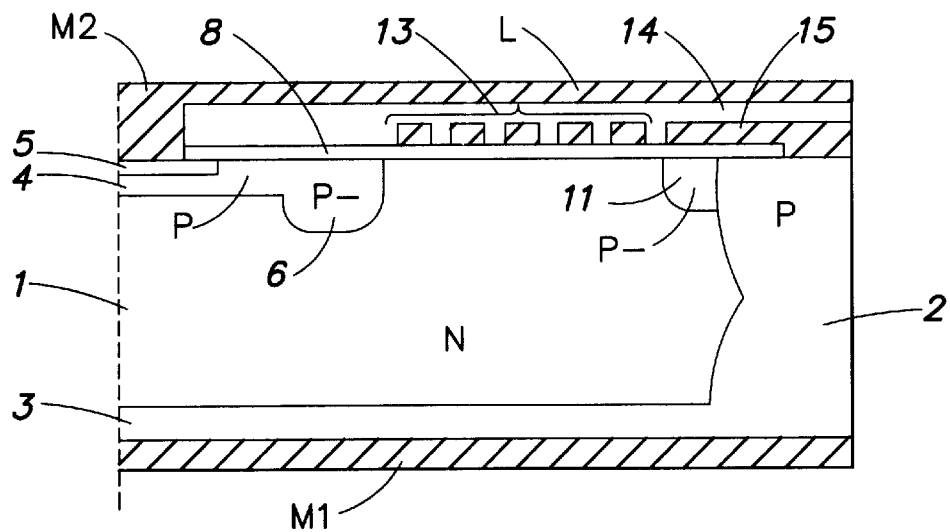
Figure 4:
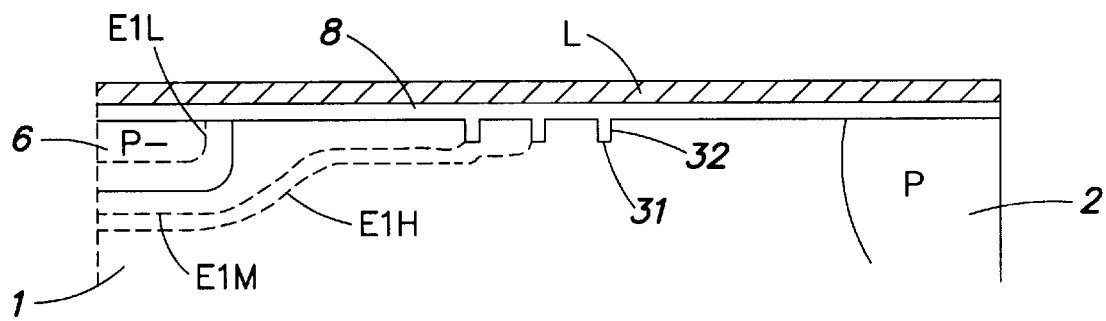
FIG. 4 is a simplified cross-sectional view of a limiting area of a high voltage component according to the present invention.

FIG. 4 shows the same border region of a high voltage component as that shown in FIG. 1. However, in FIG. 4, a larger scale has been used widthwise to better illustrate the present invention.

According to the present invention, it is provided to form in the upper surface of substrate 1, substantially at mid-distance between the external limit of P region 6 and the internal limit of P insulating wall 2, a succession of trenches 31. These trenches are completely filled with an insulator 32.

Preferably, trenches 31 are formed before the deposition of insulating layer 8 and have a width on the order of the thickness of insulating layer 8 so that, upon deposition of insulating layer 8, the trenches are automatically filled up.

The trenches extend transversally to the direction of track L, their length being preferably slightly greater than the length of track L. For example, the trench length will be substantially twice the width of track L and they will extend on either side beyond this track by approximately half the track width. As an example, trenches 31 have a width on the order of 1.5 to 3 µm and a depth on the order of 3 to 5 µm. The distance between trenches will for example be on the order of 10 to 30 µm.

The effect of the trenches filled with insulator upon the equipotential distribution can be explained as follows: under track L, it may be assumed that the oxide thickness is greater at the level of each trench. Thus, the load repulsion effect exerted by the high potential track is lighter at the level of the trenches which correspond to extra oxide thicknesses. Referring to FIG. 4, extreme equipotential E1H corresponding, for example, to a 600 V voltage, and an intermediary equipotential corresponding, for example, to a 500 V voltage, are considered. Intermediary equipotential E1M stops in the example shown at the level of a first trench and extreme equipotential E1H stops at the level of the second trench. Of course, this is only an example intended to help understanding the present invention. The number of trenches may be chosen according to the number of parameters which is desired to be obtained, especially according to the thickness normally provided for insulator 8, and to the maximum breakdown voltage desired for the component.

It should be noted that the present invention is efficient, whether an extension of the maximum equipotential associated with the junction between substrate 1 and region 6 or the equipotential between region 1 and insulating wall 2 is considered. In other words, the present invention is efficient in forward biasing as well as in reverse biasing.

Although it has been previously indicated that the trenches according to the present invention are provided only substantially under each of the metallization tracks, trenches such as described previously may be systematically provided to peripherally extend between the external portion of P region 6 and the internal portion of P insulating wall 2. Thus, even if the component pattern, and in particular the track arrangement, is modified, the device according to the present invention will remain efficient.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A high voltage component formed in a region of a silicon substrate of a first conductivity type delimited by a wall of the second conductivity type, having a lower surface including a first region of the second conductivity type connected to the wall, and an upper surface including at least one second region of the second conductivity type, a high voltage being likely to exist between the first and second regions and having to be withstood on the upper surface side by the junction between the second region and the substrate or by the junction between the wall and the substrate, a conductive track being likely to be at a high potential extending above the substrate between the second region and the wall, an insulating layer disposed under the track and above the substrate, and a succession of trenches extending in the substrate, perpendicular to the track, to a depth less than a depth of the second region, each trench being contiguous with the insulating layer and being filled with an insulator.

2. The component of claim 1, wherein each of the trenches has a depth on the order of 3 to 5 µm and a width on the order of 1.5 to 3 µm.

3. The component of claim 2, wherein the trenches are spaced apart by 10 to 30 µm.

4. The component of claim 1, wherein the trenches extend in the substrate over the entire component periphery.

5. The component of claim 1, wherein the trenches are spaced apart by 10 to 30 µm.

6. A semiconductor device, comprising:
a substrate formed in a region of a first conductivity type;
a first surface region, disposed on a first side of the substrate, comprising a first region of a second conductivity type;
a second surface region, disposed on a second side of the substrate, comprising a second region of the second conductivity type;
a wall, formed of the second conductivity type, for delimiting the substrate;
an insulating layer, disposed on the second surface region;
wherein the insulating layer comprises a plurality of extensions in the form of trenches, contiguous with the insulating layer, and extending into the substrate to a depth less than a depth of the second region.

7. The device of claim 6, wherein the trenches are adapted for abating the breakdown of a junction of two regions of different conductivity types.

8. The device of claim 6, wherein the trenches are filled and the insulating layer is formed concurrently by deposition of an insulator onto the substrate.

9. The device of claim 6, wherein the first surface region is contiguous with the wall.

10. The device of claim 6, further comprising a metallized conductive track disposed on the insulating layer.

11. The device of claim 10, wherein the device is adapted for operation at high potential differences between the metallized conductive track and the substrate.

12. The device of claim 11, wherein the potential is greater than 500 V.

13. The device of claim 10, wherein the length of the trenches is greater than the length of the conductive track.

14. The device of claim 6, further comprising a metallized conductive layer disposed on the first surface region.

15. The device of claim 6, wherein the trenches extend into the substrate at an angle perpendicular to the insulating layer.

16. The device of claim 6, wherein the trenches extend over substantially the entire periphery of the device.

17. The device of claim 6, wherein the trenches extend into the substrate to a depth between 3 and 5 µm.

18. The device of claim 6, wherein the trenches have a width between 1.5 and 3 µm.

19. The device of claim 6, wherein the trenches are spaced apart by 10 to 30 µm.

20. The device of claim 6, wherein the substrate comprises a silicon semiconductor substrate.

21. The device of claim 6 wherein the trenches are placed approximately at mid-distance between the second region and the wall.

22. The device of claim 6, wherein the trenches have depths substantially equal to twice their widths.

23. The device of claim 6, wherein the trenches have a width on the order of a thickness of the insulating layer.

24. A semiconductor component, comprising:
a substrate of a first conductivity type having a first surface;
a wall of a second conductivity type delimiting a periphery of the component within the substrate and extending to the first surface;
a first region of the second conductivity type formed in the substrate within the periphery of the component and extending to the first surface; and
at least one trench of insulating material formed in the substrate between the wall and the first region and extending to the first surface, a maximum depth of the at least one trench being less than a maximum depth of the first region.

25. The component of claim 24, further comprising an insulating layer disposed atop the first surface.

26. The component of claim 25, wherein the at least one trench has a width on the order of a thickness of the insulating layer.

27. The component of claim 25, further comprising a conductive track disposed above the insulating layer and extending transverse to the at least one trench.

28. The component of claim 27, wherein the component is adapted for operation at a potential difference of greater than 500V between the conductive track and the substrate.

29. The component of claim 25, wherein the at least one trench of insulating material is an extension of the insulating layer and is contiguous therewith.

30. The component of claim 29, wherein the at least one trench has a width on the order of a thickness of the insulating layer.

31. The component of claim 29, wherein:
the at least one trench comprises a plurality of separate trenches;
each of the plurality of separate trenches is formed in the substrate between the wall and the first region and extends to the first surface; and
a maximum depth of none of the plurality of separate trenches is greater than a maximum depth of the first region.

32. The component of claim 24, wherein:
the at least one trench comprises a plurality of separate trenches;
each of the plurality of separate trenches is formed in the substrate between the wall and the first region and extends to the first surface; and
a maximum depth of none of the plurality of separate trenches is greater than a maximum depth of the first region.

33. The component of claim 32, wherein the plurality of separate trenches are spaced apart by 10 to 30 µm.

34. The component of claim 24, wherein the at least one trench is adapted to abate formation of a conductive path in the substrate between the first region and the wall.

35. The component of claim 24, wherein the at least one trench extends at least substantially about an entire periphery of the first region.

36. The component of claim 24, wherein the at least one trench extends into the substrate to a depth between 3 and 5 µm.

37. The component of claim 24, wherein the at least one trench has a width between 1.5 and 3 µm.

38. The component of claim 24, wherein the substrate comprises a silicon semiconductor substrate.

39. The component of claim 24, wherein the at least one trench is disposed approximately at mid-distance between the first region and the wall.

40. The component of claim 24, wherein the at least one trench has a depth approximately equal to twice its width.

41. The component of claim 24, wherein the first region forms the emitter of a transistor or thyristor.

42. The component of claim 41, wherein at least a portion of the substrate of the first conductivity type forms the base of the transistor or thyristor.

43. The component of claim 24, wherein at least a portion of the substrate of the first conductivity type forms the base of a transistor or thyristor.

44. The component of claim 24, further comprising a second region of the second conductivity type disposed on a second surface of the substrate, opposite the first surface.

45. The component of claim 44, wherein the second region abuts the wall.

46. The component of claim 44, wherein the wall extends all the way from the first surface to the second surface.

47. The component of claim 44, wherein the second region forms the collector of a transistor or thyristor.

48. The component of claim 47, wherein at least a portion of the substrate of the first conductivity type forms the base of the transistor or thyristor.

49. The component of claim 47, wherein the first region forms the emitter of a transistor or thyristor.

50. The component of claim 49, wherein at least a portion of the substrate of the first conductivity type forms the: base of the transistor or thyristor.

51. The component of claim 24, wherein the wall extends all the way from the first surface to a second surface of the substrate, opposite the first surface.

52. The component of claim 24, wherein the first region and at least a portion of the substrate comprise active portions of a high-voltage vertical semiconductor device.

* * * * *